US007034566B2

(12) United States Patent
Cranford, Jr. et al.

(10) Patent No.: US 7,034,566 B2
(45) Date of Patent: Apr. 25, 2006

(54) METHOD AND CIRCUIT FOR INCREASED NOISE IMMUNITY FOR CLOCKING SIGNALS IN HIGH SPEED DIGITAL SYSTEMS

(75) Inventors: Hayden C. Cranford, Jr., Cary, NC (US); Joseph M. Stevens, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 10/777,952

(22) Filed: Feb. 12, 2004

(65) Prior Publication Data

US 2005/0179467 A1 Aug. 18, 2005

(51) Int. Cl.
*H03K 17/16* (2006.01)
*H03K 19/003* (2006.01)
(52) U.S. Cl. .............................. 326/30; 326/21; 326/26; 326/27; 327/108
(58) Field of Classification Search ................. 326/30, 326/21, 22, 26, 27, 83, 86; 327/108, 52, 327/313, 292, 293; 330/9, 253, 258; 713/400, 713/500, 600, 503
See application file for complete search history.

(56) References Cited

U.S. PATENT DOCUMENTS

| | | | |
|---|---|---|---|
| 5,767,698 A | 6/1998 | Emeigh et al. | |
| 6,208,702 B1 | 3/2001 | Ghoshal | |
| 6,310,495 B1* | 10/2001 | Zhang | 327/52 |
| 6,338,144 B1 | 1/2002 | Doblar et al. | |
| 6,529,036 B1* | 3/2003 | Rai | 326/30 |
| 6,687,780 B1* | 2/2004 | Garlepp et al. | 710/305 |
| 6,747,483 B1* | 6/2004 | To et al. | 326/86 |
| 6,864,704 B1* | 3/2005 | Wong et al. | 326/26 |

* cited by examiner

*Primary Examiner*—Vibol Tan
(74) *Attorney, Agent, or Firm*—Sawyer Law Group LLP

(57) ABSTRACT

Aspects for increased noise immunity for clocking signals in high speed digital systems are described. The aspects include buffering a differential clock signal with a single buffer circuit for a plurality of load circuits and configuring the single buffer circuit to adjust to alterations in the number of load circuits receiving the differential clock signal. The configuring achieves a constant bandwidth and voltage level for the clock signal output while adjusting to alterations in the number of load circuits.

15 Claims, 2 Drawing Sheets

METHOD AND CIRCUIT FOR INCREASED NOISE IMMUNITY FOR CLOCKING SIGNALS IN HIGH SPEED DIGITAL SYSTEMS

FIELD OF THE INVENTION

The present invention relates to clock signal buffering with high noise immunity for high speed digital systems.

BACKGROUND OF THE INVENTION

Clock signals within integrated circuits are utilized to control the movement of data and synchronize control signals. Typically, a specified amount of time after the estimated receipt of the leading edge of a clock signal, data transfer is accomplished within the integrated circuit. Many prior art methods for clock distribution are plagued by distortions or delays on the rising edge of the clock signal. If the rising edge is too late, the data transfer does not occur as required.

Large designs require many different circuits to be synchronized and operate at the same speed. In such systems, a high frequency clock signal must be distributed over a large chip area. Currently, attempts to distribute clock signals in the range of one gigahertz are faltering due to the parasitic properties of long wires and long wire terminations. As the attenuation of the transmission line circuit and wiring load increases, the clock signal power level at transmission line terminations (circuit clock inputs) decreases. Transmission line circuit loading and interconnect wiring attenuation can be very high in present systems. A sub-circuit receiving a weak clock signal can cause serious design difficulties.

The propagation delay of a signal, due to long wires and multiple sinks, can be reduced by "repowering" or relaying the signal utilizing simple amplifiers, called buffers. FIG. 1 illustrates a current solution in buffering clock signals in digital communications systems. The approach is to buffer a single clock signal from a clock source 10 referenced to a common ground and a common power supply with a "single-ended" buffer circuit 12a for a load circuit 14a. As more circuits 14b . . . 14n are added to a given clock source, more "single-ended" buffer circuits 12b . . . 12n are added in series to buffer the clocking signal from the source 10 to the destination circuit 14. Unfortunately, more noise is added to the clocking signal as each additional circuit is added to the clock signal path. Further, buffers introduce uncertainties in the timing of integrated circuits and require chip area.

Accordingly, a need exists for an integrated circuit clock distribution system that has high noise immunity and readily accommodates additional circuits in a clock signal path. The present invention addresses such a need.

SUMMARY OF THE INVENTION

Aspects for increased noise immunity for clocking signals in high speed digital systems are described. The aspects include buffering a differential clock signal with a single buffer circuit for a plurality of load circuits and configuring the single buffer circuit to adjust to alterations in the number of load circuits receiving the differential clock signal. The configuring achieves a constant bandwidth and voltage level for the clock signal output while adjusting to alterations in the number of load circuits.

With the present invention, a differential clock signal is utilized with the two output clock signals referenced to each other for small-swing signaling. Small-swing signaling keeps voltage amplitude well below half of the supply voltages, while better noise rejection results from the referencing of the differential signals to each other. High noise immunity is also enhanced from the use of a single buffer circuit, thus avoiding multiple stages of serial buffering. In addition, the present invention is configurable and allows for additional circuits to be added onto the clock signal source. Thus, a straightforward and effective manner of achieving an integrated circuit clock distribution system with high noise immunity is achieved. These and other advantages of the aspects of the present invention will be more fully understood in conjunction with the following detailed description and accompanying drawings.

DETAILED DESCRIPTION

The present invention relates to clock signal buffering with increased noise immunity in high speed digital systems. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
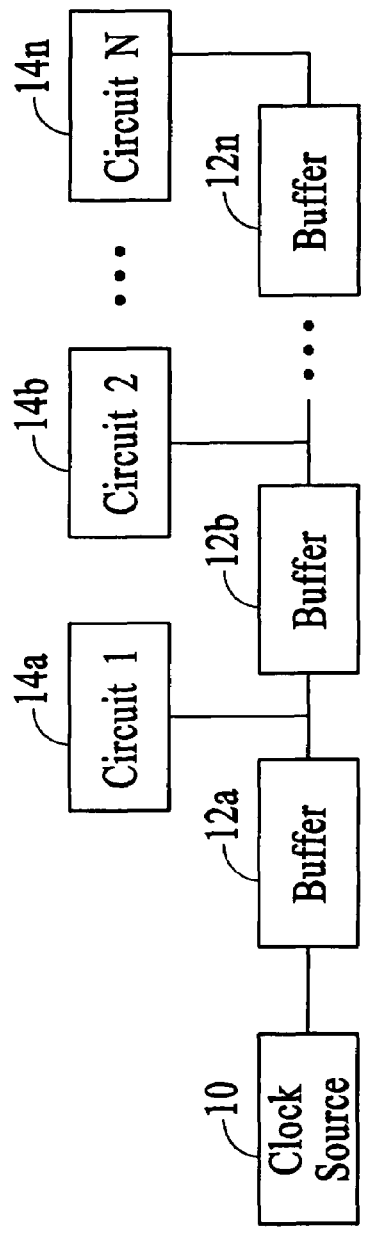
FIG. 1 illustrates a block diagram of a solution in buffering clock signals in digital communications systems in accordance with the prior art.
Figure 2:
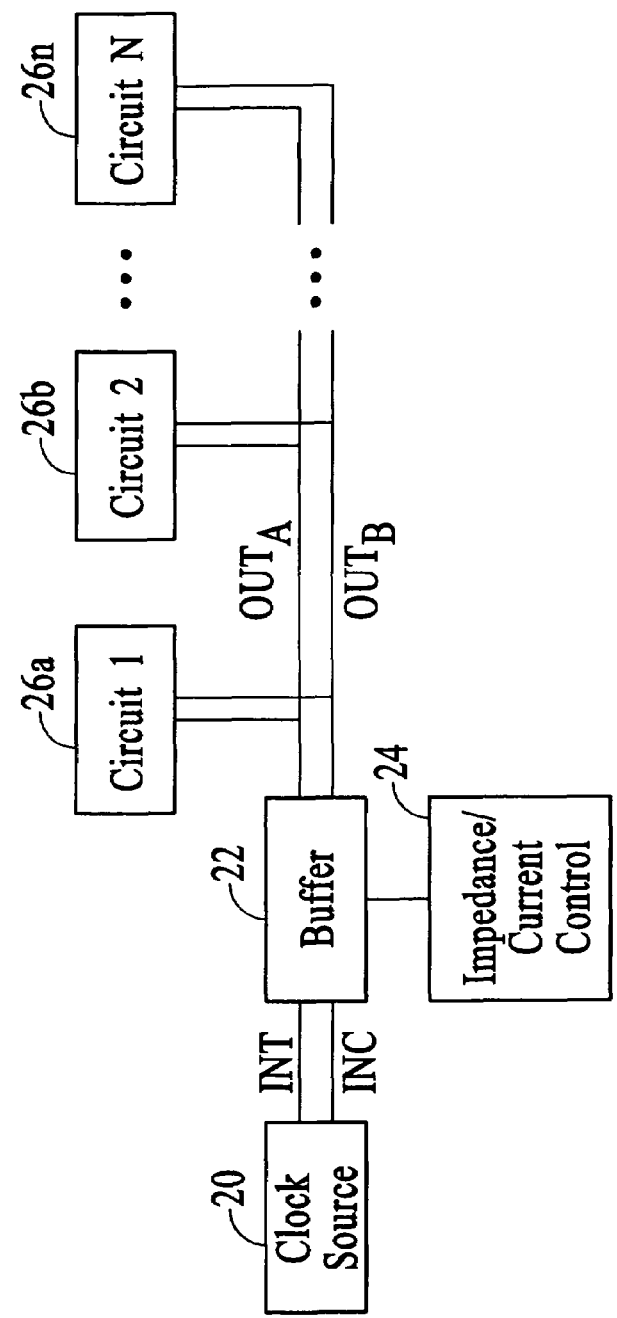
FIG. 2 illustrates a block diagram of a solution in buffering clock signals in digital communications systems in accordance with the present invention.

Referring now to FIG. 2, clock buffering in accordance with the present invention utilizes a single clock source 20, and a single buffer circuit 22, where the single buffer circuit 22 is configurable and controlled via an impedance/current control circuit 24 for N number of load circuits 26a, 26b, . . . 26n. A differential clock signal references true and complement clock signals (INT and INC) to each other for small-swing signaling. The single buffer circuit 22 includes a differential amplifier that has a programmable output impedance and a programmable current source controlled by control signals of the impedance/current control circuit, as described more particularly hereinbelow with reference to FIG. 3. In general, for a particular capacitive load (CL), the output impedance (ZO) is adjusted to the frequency bandwidth (FBW) needed on the clocking signal, where FBW= (CL)(ZO) (i.e., the output impedance is inversely proportional to the capacitive loading). Further, the output levels are proportional to output impedance and current drive (I) according to Vswing=(ZO)(I), so that the output impedance is inversely proportional to the current also.

Figure 3:
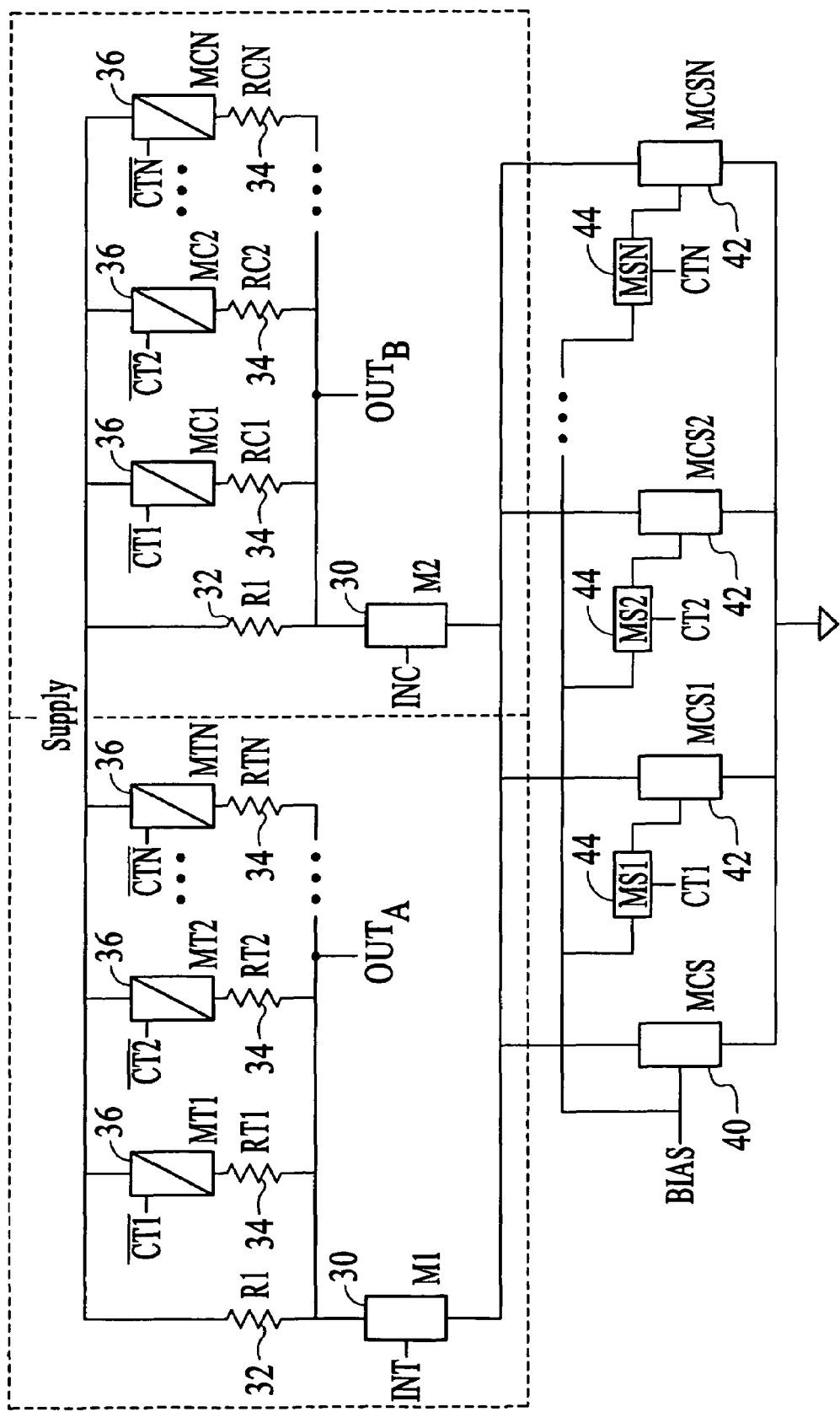
FIG. 3 illustrates a circuit diagram of a preferred embodiment of the differential amplifier with the programmable output impedance and programmable current source for the single buffer circuit of FIG. 2.

FIG. 3 illustrates a circuit diagram of a preferred embodiment of the differential amplifier with the programmable output impedance and programmable current source for the single buffer circuit 22 of the present invention. True and complement input signals of the differential clock signal (INT and INC) are received in each half of the differential amplifier portion of the circuit (designated by the dashed boxes) via steering devices 30 (e.g., transistors) M1 and M2 and output from the circuit (OUTA and OUTB) as indicated and as well understood in the art. Within each half of the differential amplifier, a first resistor 32 (R1) is coupled to a power supply and coupled in parallel to N additional resistors 34 of known value (RT1 . . . RTn for the true half and RC1 . . . RCn for the complement half) via corresponding switches 36. The additional resistors 34 are selectively added to the circuit via control signals (CT1 . . . CTn), such as from a controller (not shown), that activate their respective switches 36 (MT1 . . . MTn and MC1 . . . MCn). In the embodiment shown, the switches 36 are active low and activated by a low level control signal. Further included in the circuit is a current source device 40. The current source device 40 is coupled in parallel to N additional current source devices 42, where each additional current source device 42 is switched in when selected via activation of the respective switch 44 by the corresponding control signal (CT1 . . . CTn). The current source devices 40, 42 and switches 44 are standard components biased by a BIAS voltage, as is well understood in the art.

With this circuitry, the overall output impedance and current drive level can be adjusted in tandem in inverse proportion by the activation of the control signals to switch resistors and current source devices in and out as necessary. For example, activation of control signal CT1, activates switches MT1/MC1 and MS1, so that resistance RT1/RC1 is added in to reduce the overall impedance and current source MCS1 is added in to increase the current drive level. Thus, the result of a programmable output impedance in the differential amplifier is a constant bandwidth as more load is added. The result of the programmable current source and output impedance being adjusted together is a constant output voltage from the differential amplifier circuit. In this manner, the number of circuits receiving the clock signal source can be increased as desired without increasing the noise, since the present invention lacks multiple stages of serial buffering.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method comprising: buffering a differential clock signal with a single buffer circuit for a plurality of load circuits: and configuring the single buffer circuit to adjust to alterations in the number of load circuits receiving the differential clock signal, wherein noise immunity is increased; wherein configuring the single buffer circuit further comprises adjusting an impedance level of the programmable impedance circuit and adjusting a current source level of the programmable current source circuit; and wherein adjusting the impedance level and adjusting the current level further comprises utilizing a plurality of control signals to selectively activate switches in the programmable impedance circuit and programmable current source circuit.

2. The method of claim 1 wherein buffering further comprises buffering the differential clock signal with a differential amplifier circuit including a programmable impedance circuit and a programmable current source circuit.

3. The method of claim 1 wherein utilizing a plurality of control signals further comprises utilizing differing logic levels of a same control signal to add, in parallel, a resistor within the programmable impedance circuit and a current source within the programmable current source circuit.

4. A circuit comprising: a clock signal source providing a differential clock signal; and a configurable buffer circuit for receiving the differential clock signal and providing a clock signal output for a plurality of load circuits, wherein the configurable buffer circuit achieves a constant bandwidth and voltage level for the clock signal output while adjusting to alterations in the number of load circuits coupled to the configurable buffer circuit, wherein noise immunity is increased; wherein the configurable buffer circuit further comprises a differential amplifier circuit including a programmable output impedance circuit and a programmable current source circuit; and wherein the programmable output impedance circuit further comprises a first resistor, a plurality of second resistors, and a first plurality of switches, each switch coupling the first resistor to one of the plurality of second resistors in a parallel arrangement.

5. The circuit of claim 4 wherein the programmable current source circuit further comprises a first current source device, a plurality of second current source devices, and a second plurality of switches, each switch coupling the first current source device to one of the plurality of the second current source devices in a parallel arrangement.

6. The circuit of claim 5 further comprising control for providing control signals to each of the first and second plurality of switches to activate and deactivate each switch.

7. The circuit of claim 6 wherein the control further utilizes differing logic levels of a same control signal to control corresponding switches in the first and second plurality of switches.

8. The circuit of claim 5 wherein the first current source device and the plurality of second current source devices receive a same bias voltage.

9. A buffer circuit comprising: a differential amplifier circuit for receiving a differential input signal, the differential amplifier circuit including a programmable impedance circuit and a programmable current source circuit to provide a constant bandwidth and voltage level for a differential output clock signal wherein the differential output clock signal is received by a variable number of load circuits; and wherein the programmable impedance circuit further comprises a first resistor, a plurality of second resistors, and a first plurality of switches, each switch coupling the first resistor to one of the plurality of second resistors in a parallel arrangement.

10. The buffer circuit of claim 9 wherein the programmable current source circuit further comprises a first current source device, a plurality of second current source devices, and a second plurality of switches, each switch coupling the first current source device to one of the plurality of the second current source devices in a parallel arrangement.

11. The buffer circuit of claim 10 further comprising control for providing control signals to each of the first and second plurality of switches to activate and deactivate each switch.

12. The buffer circuit of claim 11 wherein the control further utilizes differing logic levels of a same control signal to control corresponding switches in the first and second plurality of switches.

13. The buffer circuit of claim 10 wherein the first current source device and the plurality of second current source devices receive a same bias voltage.

14. A circuit comprising:

a clock signal source providing a differential clock signal; and a configurable buffer circuit for receiving the differential clock signal and providing a clock signal output for a plurality of load circuits, wherein the configurable buffer circuit comprises a differential amplifier circuit including a programmable output impedance circuit and a programmable current source circuit, wherein the programmable output impedance circuit further comprises a first resistor, a plurality of second resistors, and a first plurality of switches, each switch coupling the first resistor to one of the plurality of second resistors in a parallel arrangement, and wherein the configurable buffer circuit achieves a constant bandwidth and voltage level for the clock signal output while adjusting to alterations in the number of load circuits coupled to the configurable buffer circuit, wherein noise immunity is increased.

15. A buffer circuit comprising:

a differential amplifier circuit for receiving a differential input signal, the differential amplifier circuit including a programmable impedance circuit comprising a first resistor, a plurality of second resistors, and a first plurality of switches, each switch coupling the first resistor to one of the plurality of second resistors in a parallel arrangement, and a programmable current source circuit to provide a constant bandwidth and voltage level for a differential output clock signal wherein the differential output clock signal is received by a variable number of load circuits.

* * * * *